(12) United States Patent
Lin et al.

(10) Patent No.: US 11,411,097 B2
(45) Date of Patent: Aug. 9, 2022

(54) SEMICONDUCTOR DEVICE (71) Applicant: Taiwan Semiconductor Manufacturing Company, Ltd., Hsinchu (TW)

(72) Inventors: Yi-Chuan Lin, Hsinchu (TW); Chiang-Ming Chuang, Changhua (TW); Shang-Yen Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/068,769

(22) Filed: Oct. 12, 2020

(65) Prior Publication Data
US 2021/0043752 A1 Feb. 11, 2021

Related U.S. Application Data (62) Division of application No. 16/180,026, filed on Nov. 5, 2018, now Pat. No. 10,825,914.

(Continued)

(51) Int. Cl.
| | |
|---|---|
| *H01L 29/66* | (2006.01) |
| *H01L 29/417* | (2006.01) |
| *H01L 29/49* | (2006.01) |
| *H01L 21/762* | (2006.01) |
| *H01L 21/02* | (2006.01) |
| *H01L 21/3105* | (2006.01) |
| *H01L 27/11546* | (2017.01) |
| *H01L 29/423* | (2006.01) |
| *H01L 21/321* | (2006.01) |

(52) U.S. Cl.
CPC .. *H01L 29/66545* (2013.01); *H01L 21/02381* (2013.01); *H01L 21/02532* (2013.01); *H01L 21/02639* (2013.01); *H01L 21/31055* (2013.01); *H01L 21/76294* (2013.01); *H01L 27/11546* (2013.01); *H01L 29/41783* (2013.01); *H01L 29/42328* (2013.01); *H01L 29/495* (2013.01); *H01L 29/6653* (2013.01); *H01L 21/3212* (2013.01)

(58) Field of Classification Search
CPC ......... H01L 29/66545; H01L 21/02381; H01L 21/02532; H01L 21/02639; H01L 21/31055
See application file for complete search history.

(56) References Cited

U.S. PATENT DOCUMENTS

11,189,714 B2 * 11/2021 Huang .............. H01L 29/66545
11,189,727 B2 * 11/2021 Jangjian .......... H01L 21/823475
(Continued)

*Primary Examiner* — Thao P Le
(74) *Attorney, Agent, or Firm* — JCIPRNET (57) ABSTRACT

Provided is a semiconductor device including a substrate, a plurality of memory cells, and at least one dummy gate structure. The substrate has a memory cell region and a dummy region. The memory cells are disposed on the substrate in the memory cell region. Each memory cell includes: adjacent two stack structures disposed on the substrate; two select gates respectively disposed outside the adjacent two stack structures; and an erase gate disposed between the adjacent two stack structures. The erase gate has a step between a topmost top surface and a lowermost top surface of the erase gate. The at least one dummy gate structure is disposed on the substrate in the dummy region.

20 Claims, 8 Drawing Sheets

Related U.S. Application Data

(60) Provisional application No. 62/584,918, filed on Nov. 13, 2017.

(56) References Cited

U.S. PATENT DOCUMENTS

| | | | |
|---|---|---|---|
| 2016/0190146 A1* | 6/2016 | Zhang | H01L 29/7881 438/257 |
| 2019/0035801 A1* | 1/2019 | Wu | H01L 21/76 |
| 2019/0088561 A1* | 3/2019 | Lin | H01L 27/11524 |
| 2021/0376120 A1* | 12/2021 | Chen | H01L 29/7883 |

* cited by examiner

SEMICONDUCTOR DEVICE

CROSS-REFERENCE TO RELATED APPLICATION

This is a divisional application of and claims the priority benefit of U.S. application Ser. No. 16/180,026, filed on Nov. 5, 2018, now allowed. The prior application claims the priority benefit of U.S. provisional application Ser. No. 62/584,918, filed on Nov. 13, 2017. The entirety of each of the above-mentioned patent applications is hereby incorporated by reference herein and made a part of this specification.

BACKGROUND

As the semiconductor industry has progressed into nanometer technology process nodes in pursuit of higher device density, higher performance, and lower costs, there have been challenges in reducing topography variations and suppressing an increase in the number of lithography operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral circuits such as logic circuits. The peripheral circuits may also include dynamic random access memories (DRAMs), static random access memories (SRAMs), or a combination thereof. The NVM cells generally require a stack structure in which plural layers, such as polysilicon layers, are stacked, while the peripheral logic circuits generally include field effect transistors (FETs) having a single polysilicon layer. Because of the structure differences, when, for example, a conductive layer over the NVM cells and the peripheral logic circuits is patterned to form word lines and gate electrodes respectively, there is a height difference in the conductive layer between an NVM cell region and a peripheral logic circuit region. Such a height difference may affect the performance of further etching process on the conductive layer.

FIGS. 1A-1L are cross sectional views illustrating a sequential process for manufacturing a semiconductor device including a memory according to one embodiment of the present disclosure. It is understood that additional operations can be provided before, during, and after processes shown by FIGS. 1A-1L, and some of the operations described below can be replaced or eliminated, for additional embodiments of the method.

Figure 1A:
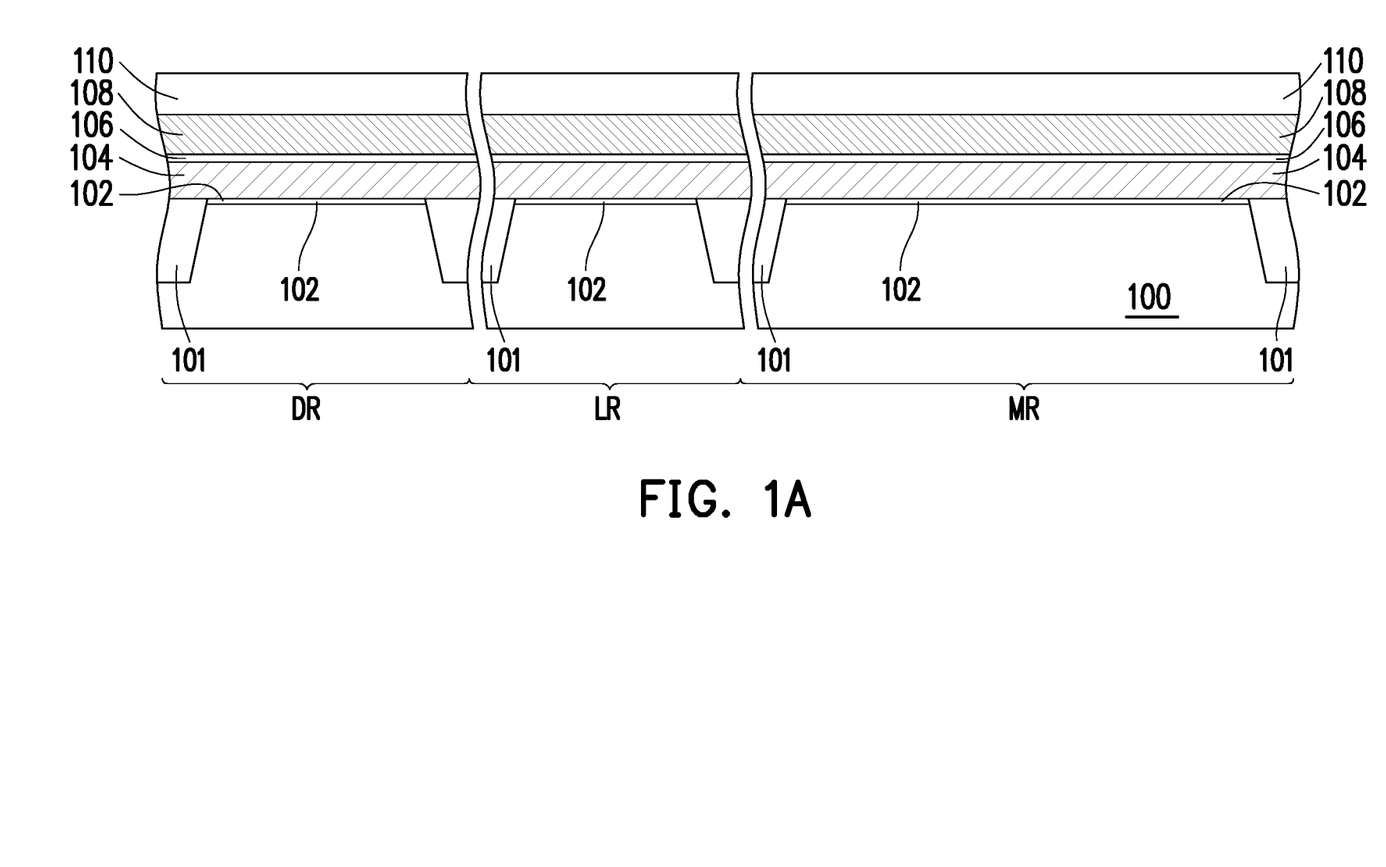
FIGS. 1A-1L are cross sectional views illustrating a sequential process for manufacturing a semiconductor device including a memory according to one embodiment of the present disclosure.

Referring to FIG. 1A, a substrate 100 is provided. In some embodiments, the substrate 100 is, for example, a p-type silicon substrate with a dopant concentration in a range from about $1\times10^{15}$ cm$^{-3}$ to about $1\times10$ cm$^{-3}$. In other embodiments, the substrate is an n-type silicon substrate with a dopant concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

Referring to FIG. 1A, a plurality of isolation structures 101 are formed in the substrate 100. The isolation structures 101 is shallow trench isolations (STI), for example. In some embodiments, the isolation structures 101 may be formed by the following steps. A mask layer (not shown) is formed on the substrate 100, and the mask layer is patterned by lithography and etching operations. Then, by using the patterned mask layer as an etching mask, the substrate 100 is etched to form trenches. A depth of the trenches is in a range from about 250 nm to about 350 nm in some embodiments. The trenches are filled with an insulating or dielectric material such as silicon oxide, and then, a planarization operation, such as CMP or an etch-back process, is performed so as to remove an upper part of the insulating material layer, thereby forming the isolation structures 101.

The region of the substrate 100 is not etched and surrounded or separated by the isolation structures 101 in top view is referred as active regions. As shown in FIG. 1A, in some embodiments, the substrate 100 includes a dummy region DR, a logic region LR, and a memory cell region MR. The dummy region DR, the logic region LR, and the memory cell region MR may be separated by isolation structures 101. In some embodiments, the memory cell region MR includes non-volatile memory (NVM) cells such as flash memory cells, and the logic region LR may include logic circuits (e.g., transistors), volatile memory cells (e.g., DRAMs, SRAMs or the like), or a combination thereof. The dummy region DR is basically referred as other regions out of the memory cell region MR and the logic region LR. In some alternative embodiments, the number and the arrangement of the dummy region DR, the logic region LR, and the memory cell region MR may be adjusted based on the design and the requirements of the products.

After the isolation structures 101 are formed, a first dielectric layer 102, a first conductive layer 104, a second dielectric layer 106, a second conductive layer 108, and a cap layer 110 are sequentially formed over the substrate 100. In some embodiments, in the memory cell region MR, the first dielectric layer 102 is to be used as a tunnel dielectric layer of the memory cell; the first conductive layer 104 is to be used as a floating gate of the memory cell; and the second conductive layer 108 is to be used as a control gate of the memory cell.

The first dielectric layer 102 utilized as a tunnel oxide layer for memory cells is made of silicon oxide in some embodiments. The thickness of the first dielectric layer 102 is in a range from about 1 nm to about 50 nm in some embodiments. The first dielectric layer 102 can be formed by thermal oxidation or chemical vapor deposition (CVD).

The first conductive layer 104 is polysilicon in some embodiments. In other embodiments the first conductive layer is any suitable metal or metal nitride for use as a gate electrode. The first conductive layer 104 can be formed by CVD. The thickness of the first conductive layer 104 as deposited is in a range from about 20 nm to about 200 nm in some embodiments. In some embodiments, the thickness of the first conductive layer 104 is reduced by a planarization operation, such as chemical-mechanical polishing (CMP) or an etch-back method. After the planarization operation, the thickness of the first conductive layer 104 is in a range from about 10 nm to about 50 nm in some embodiments. In some embodiments, the first conductive layer 104 is polysilicon and appropriately doped with p-type dopants (e.g., boron) or n-type dopants (e.g., phosphorus). In some other embodiments, the first conductive layer 104 is an amorphous silicon layer.

The second dielectric layer 106 includes a silicon oxide layer, a silicon nitride layer or multilayers of silicon oxide and silicon nitride in some embodiments. In one embodiment, a silicon oxide-silicon nitride-silicon oxide (ONO) layer is used as the second dielectric layer 106. The thickness of the second dielectric layer is in a range from about 1 nm to about 100 nm in some embodiments. The second dielectric layer 106 can be formed by CVD, physical vapor deposition (PVD) or atomic layer deposition (ALD).

The second conductive layer 108 can be a polysilicon layer formed by CVD, and the thickness of the second conductive layer 108 is in a range from about 10 nm to about 100 nm, in some embodiments. In some other embodiments, the second conductive layer 108 is polysilicon and appropriately doped with p-type dopants (e.g., boron) or n-type dopants (e.g., phosphorus).

The cap layer 110 is made of silicon oxide or silicon nitride formed by CVD, and the thickness thereof is in a range from about 100 nm to about 250 nm, in some embodiments. In some embodiments, the cap layer 110 includes one or more layers. For example, the cap layer 110 is a composite structure including ONO three layers made of silicon oxide, silicon nitride, and silicon oxide in order. In some embodiments, the thickness of each of the layers of the composite structure may be the same or different from each other.

Figure 1B:
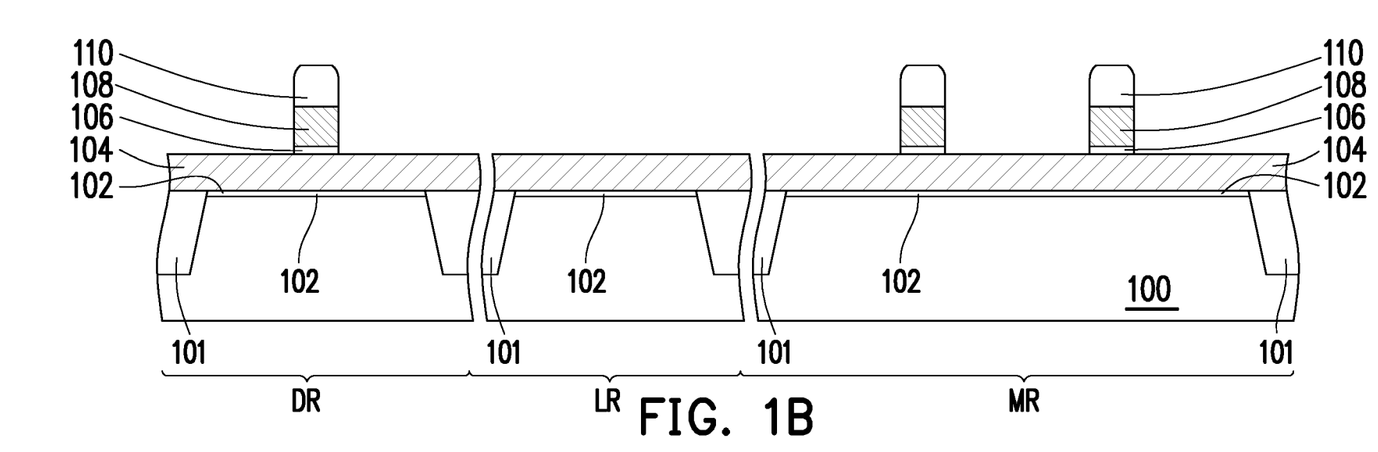

Next, a patterning operation including lithography and etching is performed, the cap layer 110, the second conductive layer 108 and the second dielectric layer 106 are patterned as shown in FIG. 1B.

Figure 1C:
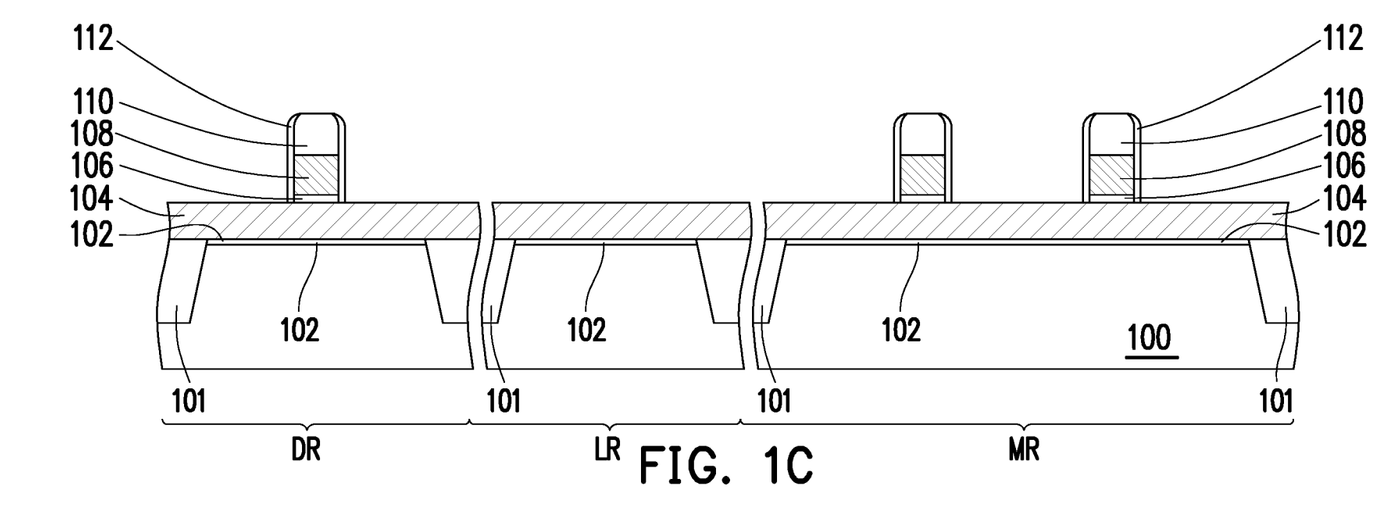

After the patterning operation of the cap layer 110, the second conductive layer 108 and the second dielectric layer 106, first spacers 112 are formed on opposing sides of the patterned cap layer 110, second conductive layer 108 and second dielectric layer 106, as shown in FIG. 1C. In some embodiments, the first spacers 112 are made of one or more layers of suitable dielectric material. One or more blanket layers of dielectric material are formed, for example by CVD, over the entire substrate 100 and then anisotropic etching is performed, thereby forming the first spacers 112. The thickness of the first spacers 112 is in a range from about 10 nm to about 50 nm in some embodiments. Although the first spacers 112 illustrated in FIG. 1C is single layer, it should not limit various embodiments of the present disclosure. In some alternative embodiments, the first spacers 112 include an ONO film having a silicon nitride layer sandwiched by two silicon oxide layers (not shown). In some other embodiments, the first spacers 112 are made of a single layer of silicon nitride or silicon oxynitride.

Figure 1D:
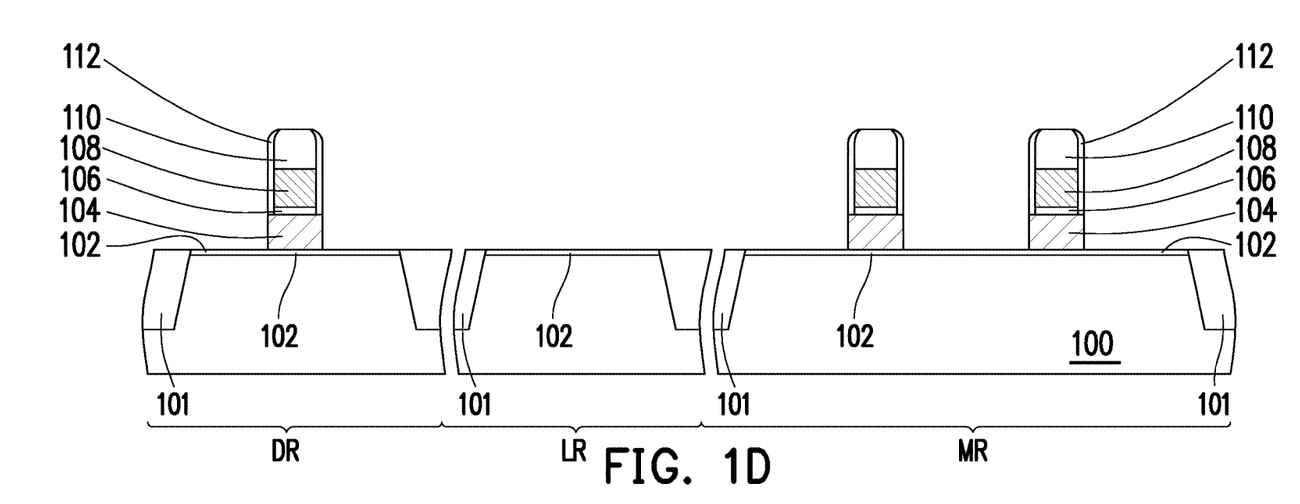

After the first spacers 112 are formed, the first conductive layer 104 is patterned by using dry etching operations with the first spacers 112 and the patterned cap layer 110 as a mask layer, as shown in FIG. 1D. In the case, as shown in FIG. 1D, a width of the patterned first polysilicon layer 104 is greater than a width of the patterned second conductive layer 108.

Figure 1E:
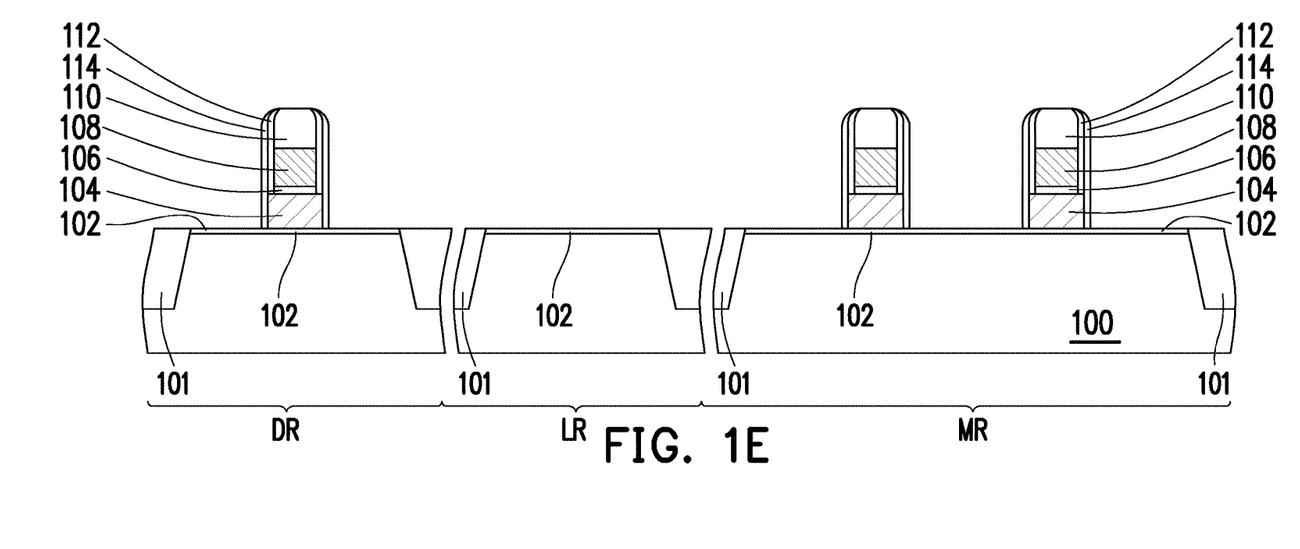
Figure 1F:
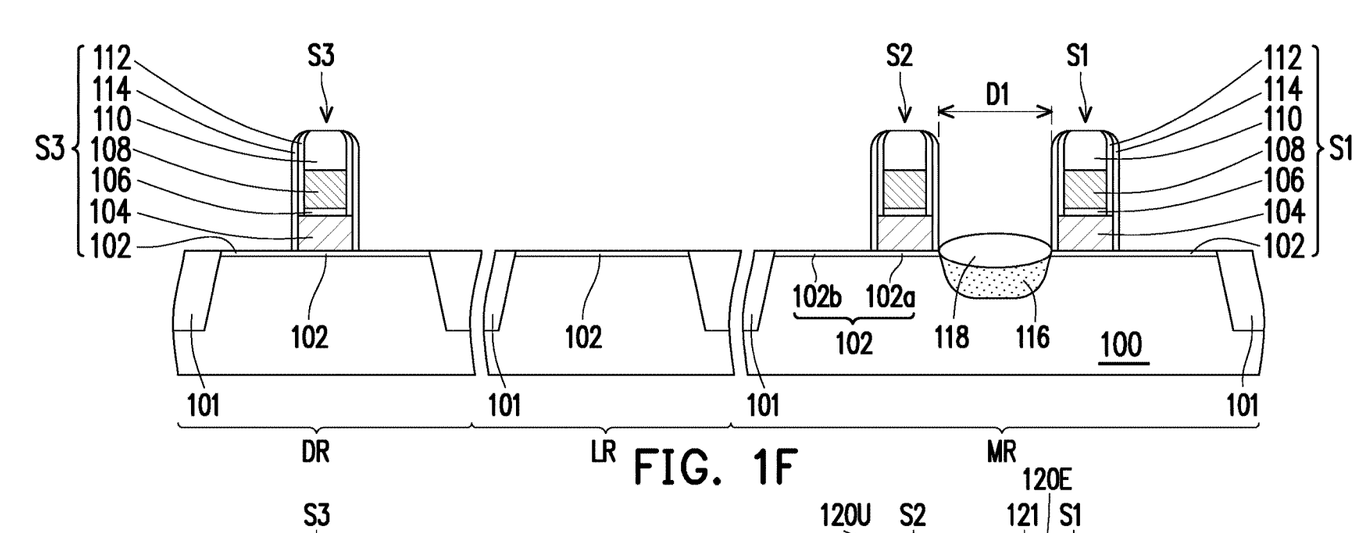

Further, second spacers 114 are formed as shown in FIG. 1E, and an erase-gate dielectric layer 118 is formed on the substrate 100 in the memory cell region MR as shown in FIG. 1F. In some embodiments, the second spacers 114 are made of one or more layers of dielectric material. In one embodiment, the second spacers 114 are made of silicon oxide formed by CVD. The erase-gate dielectric layer 118 is made of silicon oxide. In some embodiments, a silicon oxide layer is formed and then the silicon oxide layer is patterned to remove the silicon oxide layer from an erase gate area, and then wet oxidation is performed, thereby forming the erase-gate dielectric layer 118. In some embodiments, a gate dielectric layer for select gates (e.g., word line) is also formed. In some embodiments, the first dielectric layer 102 remains as the gate dielectric layer, and in certain embodiments, exposed portions of the first dielectric layer 102 to be used as the gate dielectric layer for the select gates is thinned. That is, the first dielectric layer 102 includes a first dielectric layer 102a below the first conductive layer 104 and a first dielectric layer 102b exposed by the first conductive layer 104. A first thickness of the first dielectric layer 102a and a second thickness of the first dielectric layer 102b are different from each other. In some embodiments, the first thickness of the first dielectric layer 102a are greater than or less than the second thickness of the first dielectric layer 102b. In some alternatively embodiments, the first thickness of the first dielectric layer 102a below the first conductive layer 104 and the second thickness of the first dielectric layer 102b exposed by the first conductive layer 104 are the same.

By the foregoing operations, stack structures S1, S2 and S3 are formed as shown in FIG. 1F. In detail, each of the stack structures S1, S2 and S3 from bottom to top sequentially includes the first dielectric layer 102, the first conductive layer 104, the second dielectric layer 106, the second conductive layer 108, and the cap layer 110. Each of the stack structures S1, S2 and S3 further includes the first spacer 112 overlying sidewalls of the second dielectric layer 106, the second conductive layer 108 and the cap layer 110, and the second spacers 114 overlying the first spacer 112 and the first conductive layer 104. In some embodiments, adjacent two stack structures S1 and S2 are to be a pair of memory cells over the substrate 100 in the memory cell region MR, and the stack structure S3 is a dummy gate structure over the substrate 100 in the dummy region DR. In some embodiments, the dummy gate structure (e.g., the stack structure S3) and pair of memory cells (e.g., the stack structures S1 and S2) are formed simultaneously. In some embodiments, a distance D1 between the adjacent two stack structures S1 and S2 is in a range from about 200 nm to about 400 nm.

After the erase-gate dielectric layer 118 is formed, an ion implantation process is performed to form a doped region 116 in the substrate 100 below the erase-gate dielectric layer 118. In some embodiments, the doped region 116 is a common source region. The doped region 116 may be doped with p-type dopants or n-type dopants. In some embodiments, the substrate 100 or the well (not shown) in the substrate 100 is an p-type substrate or a p-well, n-type dopants (e.g., phosphorus) may be doped in the substrate 100 or the well to form the doped region 116. In some other embodiments, the substrate or the well in the substrate 100 is an n-type substrate or an n-well, p-type dopants (e.g., boron) may be doped in the substrate 100 or the well to form the doped region 116.

Figure 1G:
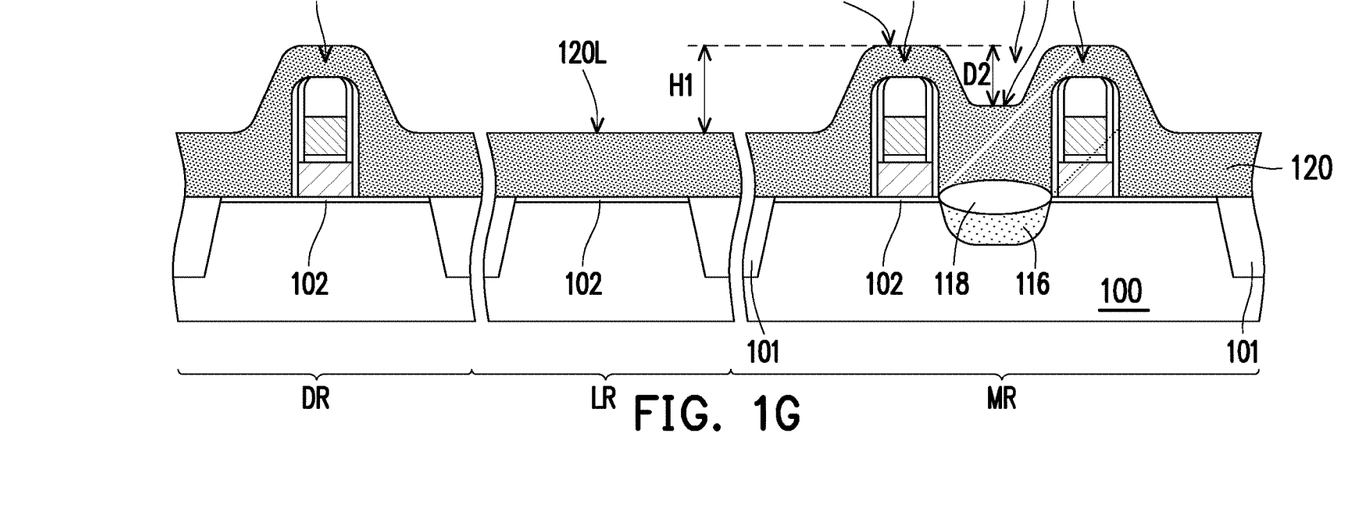

Then, as shown in FIG. 1G, a third conductive layer 120 is formed over the structure of FIG. 1F. That is, the third conductive layer 120 is formed to cover the stack structures S1, S2, and S3, the first dielectric layer 102, and the erase-gate dielectric layer 118. In some embodiments, the third conductive layer 120 includes a polysilicon layer, such as a doped polysilicon layer or an undoped polysilicon layer. The third conductive layer 120 may be formed by the same processes as the first or second conductive layers 104, 106. The third conductive layer 120 is conformally formed by CVD in some embodiments, as shown in FIG. 1G. That is, the third conductive layer 120 has a recess 121 between the stack structures S1 and S2 and over the erase-gate dielectric layer 118. In some embodiments, a depth D2 of the recess 121 is in a range from about 50 nm to about 100 nm. On the other hand, a height difference H1 measured at a flat surface between a top surface 120L of the third conductive layer 120 in the logic region LR and a topmost surface 120U of the third conductive layer 120 over the stack structure S2 is in a range from about 200 nm to about 300 nm in some embodiments. As shown in FIG. 1G, the top surface 120L of the third conductive layer 120 in the logic region LR is lower than the top surface 120E of the third conductive layer 120 over the erase-gate dielectric layer 118.

Figure 1H:
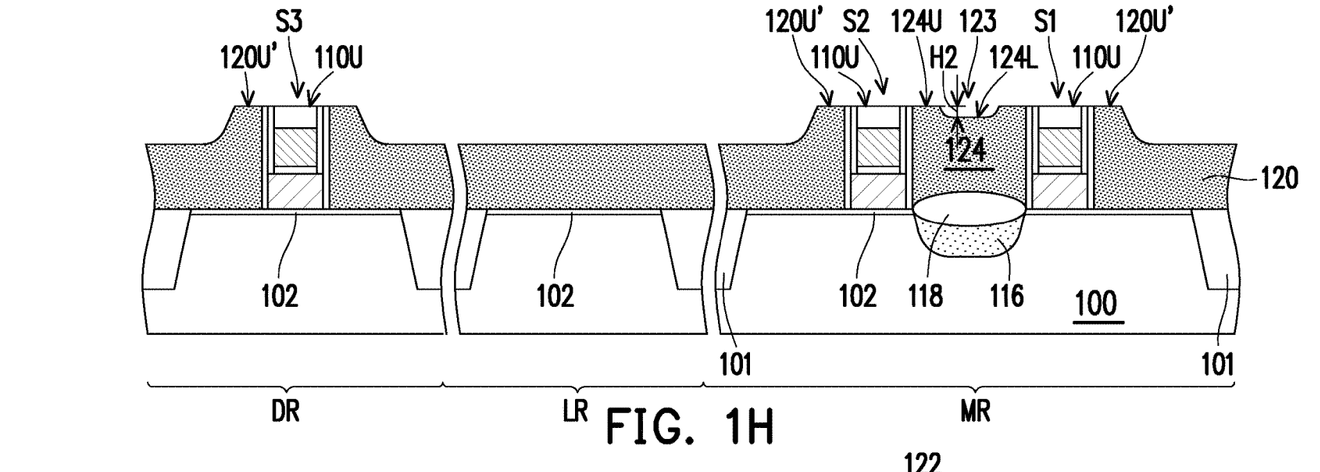

Then, as shown in FIG. 1H, a planarization process is performed to remove an upper portion of the third conductive layer 120, so that top surfaces 110U of the stack structures S1, S2, and S3 are exposed. In some embodiments, the planarization process includes a chemical-mechanical polishing (CMP) process. In some embodiments, the upper portions of the cap layer 110, the first spacers 112, and the second spacers 114 are also removed to ensure that the third conductive layer 120 over the stack structures S1, S2, and S3 is completely removed. In the case, as shown in FIG. 1H, the top surfaces 110U of the stack structures S1, S2, and S3 and the topmost surface 120U' of the third conductive layer 120 around the stack structures S1, S2, and S3 are coplanar. By the planarization process, an erase gate 124 is formed between the stack structures S1 and S2. As shown in FIG. 1H, a step 123 exists between a topmost top surface 124U and a lowermost top surface 124L of the erase gate 124. In some embodiment, a step height H2 of the step 123 ranges from 1 nm to 50 nm.

Figure 2:
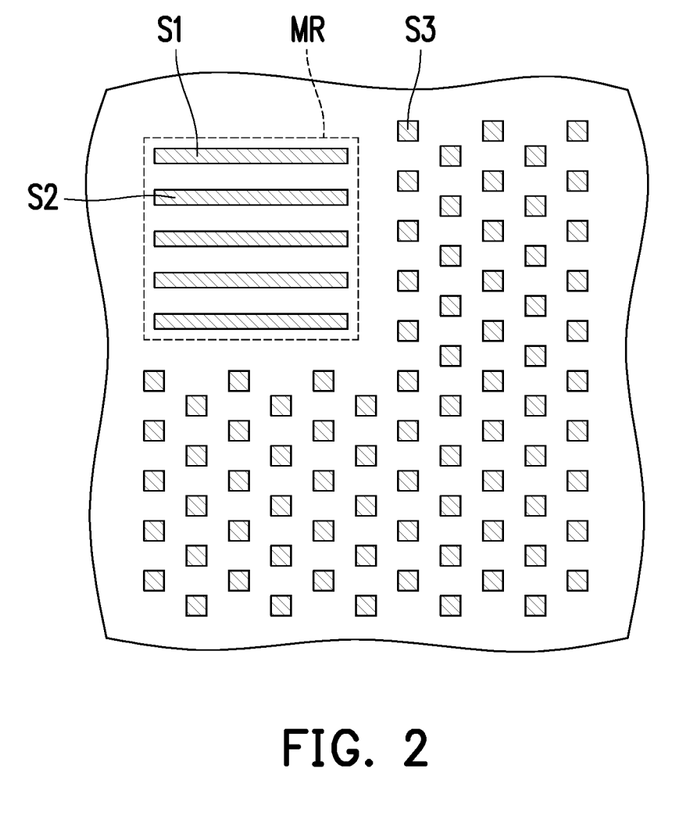
FIG. 2 is a top view of a semiconductor device including a memory according to another embodiment of the present disclosure.

It should be noted that, the stack structure S3 (e.g., the dummy gate) over the substrate 100 in the dummy region DR is able to reduce a loading effect of the CMP process. The loading effect of the CMP process occurs due to a difference in pattern densities between the memory cell region MR and other regions out of the memory cell region MR. That is, as shown in FIG. 2, a ratio of a sum area of the stack structures S1, S2, and S3 projected onto the substrate 100 and an area of the substrate 100 may increase to a range from 10% to 90%, for example. Therefore, in the present embodiment of the disclosure, the loading effect of the CMP process of FIG. 2 may be reduced compared with only the stack structures S1 and S2 formed over the substrate 100.

The stack structures S3 are arranged around the stack structures S1 and the stack structures S2. In some embodiments, the stack structures S3 are arranged around ends of the stack structures S1 and S2, and aside the stack structures S1 and S2, but not limited thereto. In some embodiments, the stack structures S3 are distributed evenly. In some other embodiments, the stack structures S3 are distributed unevenly.

In some embodiments, the stack structures S3 have the same pattern. In some other embodiments, the stack structures S3 have different patterns. The pattern or the patterns of the stack structures S3 may be the same as or different from the patterns of the stack structures S1 or/and the stack structures S2.

In some embodiments, as shown in FIG. 2, the stack structures S1 and S2 may be strip patterns extending laterally. However, the embodiments of the present disclosure are not limited thereto. In some alternatively embodiments, the stack structures S1 and S2 may be island patterns separated from each other. Similarly, although the stack structures S3 in FIG. 2 are illustrated as a plurality of island patterns separated from each other, it should not limit various embodiments of the present disclosure. In some alternative embodiments, the stack structures S3 may be strip patterns, mesh patterns, or a combination thereof.

Figure 1I:
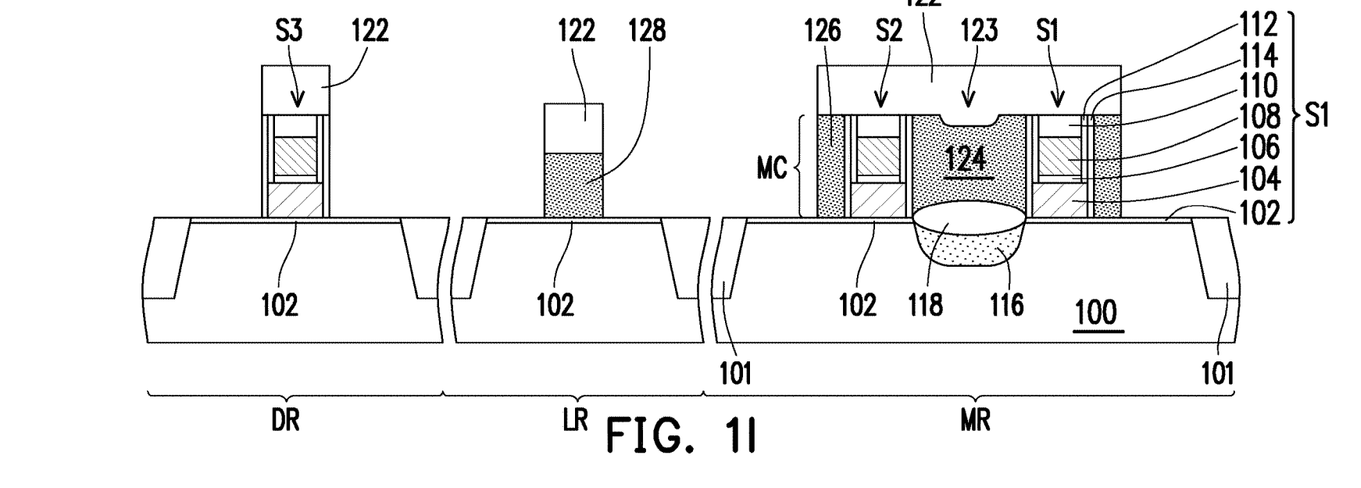

Referring to FIG. 1H and FIG. 1I, a photoresist pattern 122 is subsequently formed over the structure of FIG. 1H. By using the photoresist pattern 122 as an etching mask, the third conductive layer 120 uncovered by the photoresist pattern 122 is patterned such as by etching, to remove a portion of the third conductive layer 120, thereby forming select gates 126 (e.g., word lines) outside the stack structures S1, S2, respectively, as shown in FIG. 1I. At the same time, as shown in FIG. 1I, a logic gate 128 is also formed during the process of patterning the third conductive layer 120, in some embodiments. In some embodiments, the third conductive layer 120 over the substrate 100 in the dummy region DR is removed, so as to expose the top surface of the first dielectric layer 102 during patterning the third conductive layer 120.

Figure 1J:
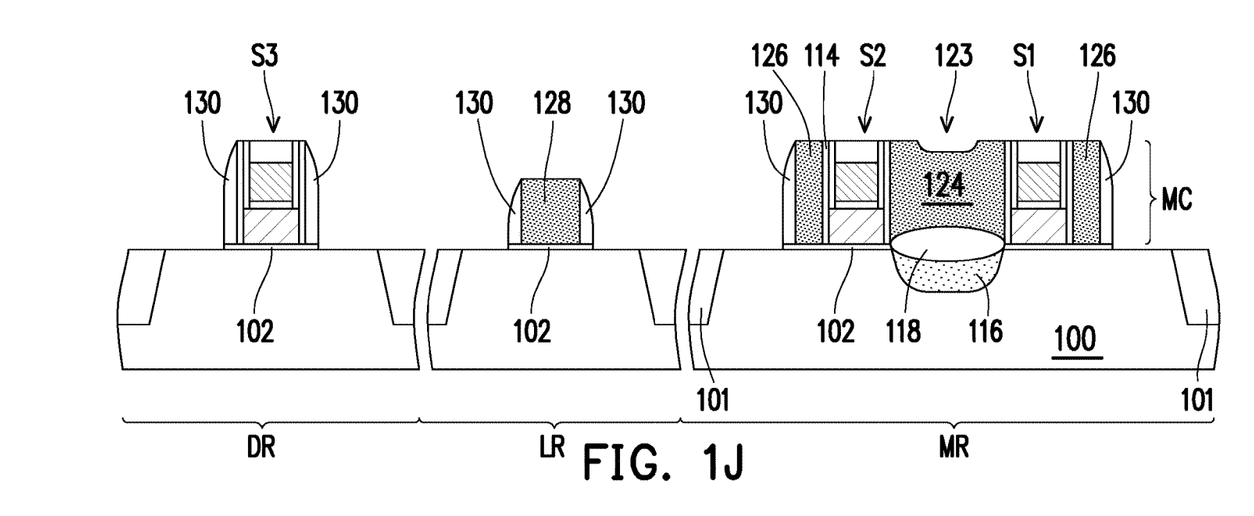

Referring to FIG. 1J, the photoresist pattern 122 is removed. In some embodiments, a height of the logic gate 128 is lower than a height of the stack structures S1, S2, and S3. Although the number of the logic gate 128 illustrated in FIG. 1J is only one, it should not limit various embodiments of the present disclosure. In some alternative embodiments, the number and the arrangement of the logic gate 128 may be adjusted based on the design and the requirements of the products.

After the select gates 126 are formed, as shown in FIG. 1I and FIG. 1J, a pair of memory cells MC is formed over the substrate 100 in the memory cell region MR. In detail, the pair of memory cells MC includes adjacent two stack structures S1 and S2, the erase gate 124 between the stack structures S1 and S2, and the select gates 126 over the opposite sidewalls of the stack structures S1, S2, respectively. Each of the stack structures S1 and S2 from bottom to top sequentially includes the first dielectric layer 102 used as the tunnel dielectric layer (hereinafter referred as the tunnel dielectric layer 102), the first conductive layer 104 used as the floating gate (hereinafter referred as the floating gate 104), the second dielectric layer 106 used as an inter-gate dielectric layer (hereinafter referred as the inter-gate dielectric layer 106), the second conductive layer 108 used as the control gate (hereinafter referred as the control gate 108), and the cap layer 110. The pair of memory cells MC further includes the first spacer 112 overlying the sidewalls of the inter-gate dielectric layer 106, the control gate 108 and the cap layer 110, and the second spacers 114 overlying the first spacer 112 and the floating gate 104. The first spacer 112 and the second spacers 114 are used to electrically isolate the floating gate 104 (or the control gate 108) from the erase gate 124, and electrically isolate the floating gate 104 (or the control gate 108) from the select gates 126.

Referring to FIG. 1I and FIG. 1J, after the photoresist pattern 122 is removed, third spaces 130 are formed over the opposite sidewalls of the stack structure S3, the opposite sidewalls of the logic gate 128, and the opposite sidewalls of the select gates 126. In some embodiments, the third spaces 130 are made of one or more layers of suitable dielectric material, such as silicon oxide, silicon nitride, silicon oxynitride or a combination thereof. The third spaces 130 may be formed by the same processes as the first or second spacers 112, 114. Thus, details thereof are omitted here. In some embodiments, as shown in FIG. 1J, a height of the third spaces 130 and a height of the second spacers 114 are the same. That is, the third spaces 130 and the second spacers 114 are at the same level. In other words, a highest level of the third spaces 130, a highest level of the first spacers 112, and a highest level of the second spacers 114 are the same. In some other embodiments, a height difference between a topmost of the third spaces 130 and a topmost of the second spacers 114 is less than about 100 nm. The height difference between a topmost of the third spaces 130 and a topmost of the second spacers 114 is in a range from about 30 nm to about 100 nm.

In some embodiments, as shown in FIG. 1J, a portion of the first dielectric layer 102 not covered by the third spaces 130 is removed to expose the top surface of the substrate 100 during forming the third spaces 130.

Figure 1K:
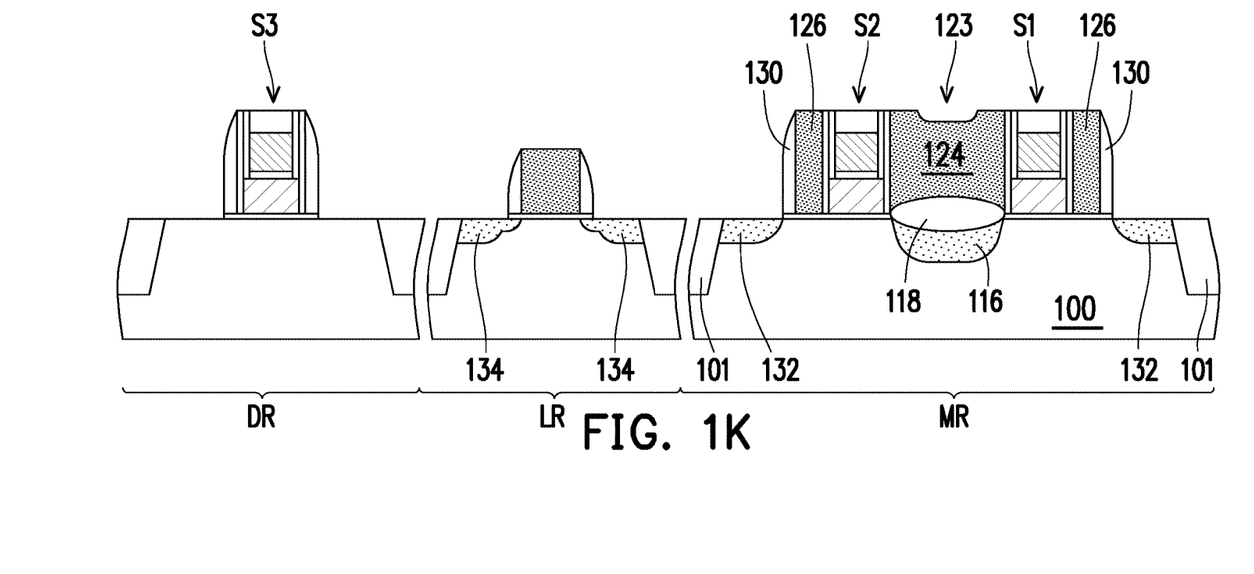

After the third spaces 130 are formed, as shown in FIG. 1K, an ion implantation process is performed on the exposed substrate 100 in the memory cell region MR, so that doped regions 132 are formed in the substrate 100 in the memory cell region MR. In detail, the doped regions 132 are formed in the substrate 100 at opposite sides of the pair of memory cells MC. In some embodiments, the doped regions 132 are referred as bit lines. The doped regions 132 may be doped with p-type dopants or n-type dopants. In some embodiments, the substrate 100 or a well in the substrate 100 is an p-type substrate or a p-well, and n-type dopants (e.g., phosphorus) may be doped in the substrate 100 or the well to form the doped regions 132. In some other embodiments, the substrate 100 or a well in the substrate 100 is an n-type substrate or an n-well, and p-type dopants (e.g., boron) may be doped in the substrate 100 or the well to form the doped regions 132. The doped regions 132 and the doped region 116 have the same conductive type dopants.

In some embodiments, as shown in FIG. 1K, doped regions 134 are formed in the substrate 100 in the logic region LR. In detail, the doped regions 134 are formed in the substrate 100 at opposite sides of the logic gate structure LG (including the gate dielectric layer 102 and the logic gate 128 over the gate dielectric layer 102). In some embodiments, the doped regions 134 are referred as source and/or drain region (S/D region). The doped regions 134 may be doped with p-type dopants or n-type dopants. In some embodiments, the substrate 100 or a well in the substrate 100 is an p-type substrate or a p-well, n-type dopants (e.g., phosphorus) may be doped in the substrate 100 or the well to form the doped regions 134. In some other embodiments, the substrate 100 or a well in the substrate 100 is an n-type substrate or an n-well, and p-type dopants (e.g., boron) may be doped in the substrate 100 or the well to form the doped regions 134.

In some embodiments, the doped regions 132 and 134 are formed at the same time. However, the embodiments of the present disclosure are not limited thereto. In some alternatively embodiments, the doped regions 134 are formed before forming the doped regions 132, or the doped regions 134 are formed after forming the doped regions 132. In some embodiments, the ion implantation process is performed to form the doped regions 132 and 134, while a photoresist pattern (not shown) is covered the substrate 100 in the dummy region DR to prevent the dopant implanting into the substrate 100 in the dummy region DR. In other words, doped region is not formed in the dummy region DR beside the stack structure S3.

Figure 1L:
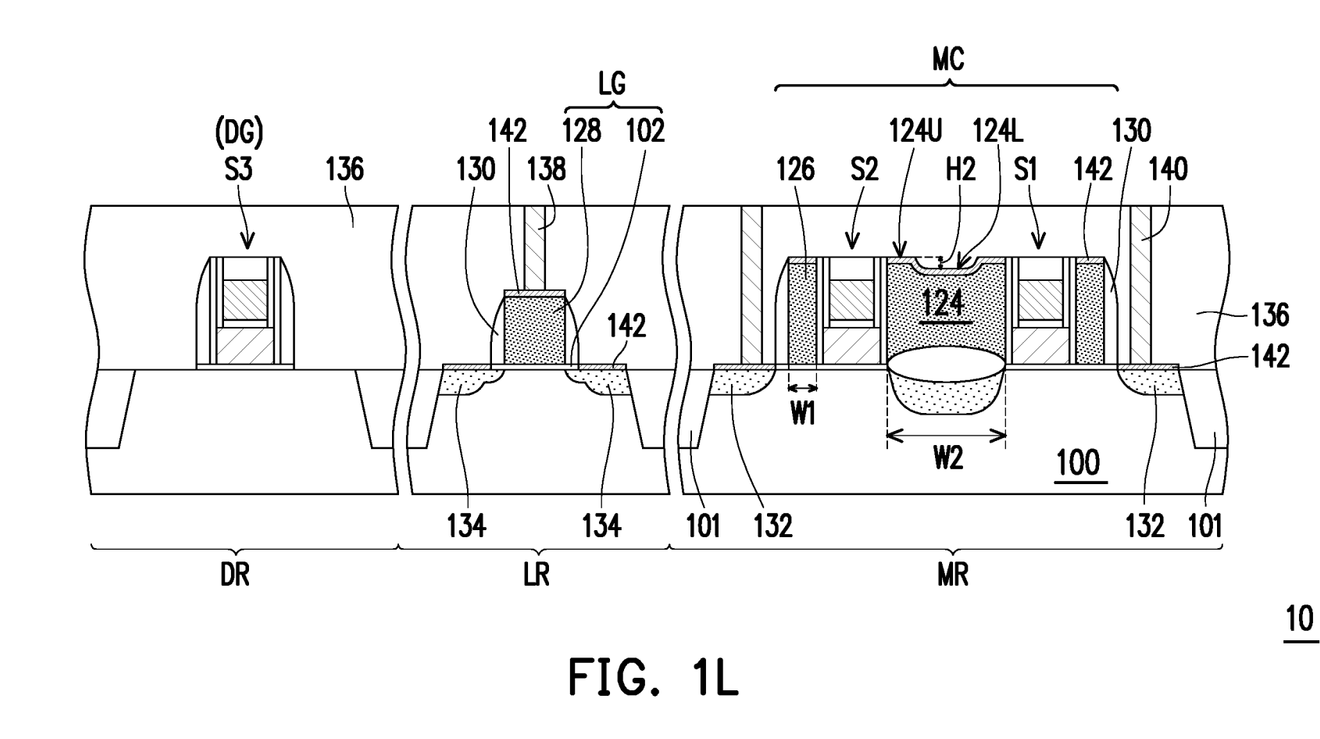

Referring to FIG. 1L, after the doped regions 132 and 134 are formed, an interlayer dielectric (ILD) layer 136 is formed over the substrate 100. In some embodiments, a ILD material layer is formed to cover the stack structure S3, the logic gate structure LG, the pair of memory cells MC and the substrate 100, and then a planarization operation such as CMP is performed, so that the ILD layer 136 is formed. In some embodiments, the ILD layer 136 includes a dielectric material, such as silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 136 includes low-k dielectric materials. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the ILD layer 136 may include one or more dielectric materials and/or one or more dielectric layers. In some embodiments, the ILD layer 136 is deposited to a suitable thickness by CVD, HDPCVD, SACVD, spin-on, or other suitable methods.

After the ILD layer 136 is formed, a contact structure 138 is formed in the ILD layer 136 to electrically connect to the logic gate 128, and contact structures 140 are formed in the ILD layer 136 to electrically connect to the doped region 132. In some embodiments, the contact structures 138 and 140 include a conductive material, such as metal, polysilicon, silicide, or a combination thereof. The metal may include W, Cu, Al, or a combination thereof. In some embodiments, the contact structures 138 and 140 are formed including following process. A mask layer (not shown) is formed over the ILD layer 136, and the mask layer is patterned by lithography and etching operations. Then, by using the patterned mask layer as an etching mask, the ILD layer 136 is etched to form contact holes (not shown) through the ILD layer 136. The contact holes are filled with the conductive material such as W, and then, a planarization operation such as CMP or an etch-back process is performed, so as to remove an upper portion of the conductive material over a top surface of the ILD layer 136, thereby forming the contact structures 138 and 140. In some embodiments, the contact structure 138 further includes a barrier layer or a glue layer such as titanium, tantalum, titanium nitride, tantalum nitride, or a combination thereof before forming the conductive material.

As shown in FIG. 1L, in some embodiments, before the ILD layer 136 is formed, a plurality of silicide layers 142 are formed over the doped regions 132 and 134, the two select gates 126, the erase gate 124, and over the logic gate 128. In some embodiments, the silicide layers 142 include nickel silicide (NiSi), cobalt silicide (CoSi), titanium silicide (TiSi), tungsten silicide (WSi), molybdenum silicide (MoSi), platinum silicide (PtSi), palladium silicide (PdSi) or a combination thereof. In some embodiments, the silicide layers 142 are formed by performing a self-aligned silicide (salicide) process including following steps. A metal layer (not shown) is formed to at least cover the doped regions 132 and 134 and the logic gate 128. Thereafter, an annealing process is carried out such that the metal layer is reacted with the doped regions 132 and 134 and the logic gate 128 in contact thereto, so as to form the silicide layers 142. The unreacted metal layer is then removed.

As shown in FIG. 1L, after the contact structures 138 and 140 are formed, a semiconductor device 10 is formed. In detail, the semiconductor device 10 includes the substrate 100, the dummy gate structure DG, the logic gate structure LG, and the memory cells MC in the dummy region DR, the logic region LR, and a memory cell region MR respectively. Each of the memory cells includes adjacent two stack structures S1 and S2, two select gates 126, and an erase gate 124. The two select gates 126 are located outside the two stack structures S1 and S2 respectively. The erase gate 124 is located between adjacent two stack structures S1 and S2. In some embodiments, as shown in FIG. 1L, the second width W2 is greater than the first width W1. In some other embodiments, the second width W2 is greater than two times of the first width W1. The first width W1 of one of the two select gates 126 is in a range from about 170 nm to about 210 nm, while the second width W2 of the erase gate 124 is in a range from about 290 nm to about 360 nm, for example.

As shown in FIG. 1L, the top surfaces of the select gates 126 are substantially flat. In some other embodiments, the top surfaces of the select gates 126 have bar-shaped surfaces in the section view or plane surfaces. In some other embodiments, a difference between a topmost top surface and a lowermost top surface of one of the select gates 126 is less than 10 nm. In other words, the top surface of one of the select gates 126 and the topmost top surface 124U of the erase gate 124 are substantially coplanar, in some embodiments. The step height H2 exists between a topmost top surface 124U and a lowermost top surface 124L of the erase gate 124, so that the top surface of the erase gate 124 is a U-shaped surface in the section view. In some embodiment, the step height H2 ranges from 1 nm to 50 nm. In other words, in some embodiments, the step height H2 between a topmost top surface 124U and a lowermost top surface 124L of the erase gate 124 is greater than the difference between the topmost top surface and the lowermost top surface of one of the select gates 126.

In some embodiments, since the top surface of the erase gate 124 has U-shaped surface, the silicide layer 142 formed over the top surface of the erase gate 124 also has the U-shaped surface. Similarly, since the top surfaces of the select gates 126 have bar-shaped surfaces or plane surfaces, the silicide layers 142 formed over the top surfaces of the select gates 126 also have bar-shaped surfaces in the section view or plane surfaces.

In some embodiments, as shown in FIG. 1L, the select gates 126 are electrically connected to an interconnect (not shown) over the ILD layer 136 by the silicide layers 142. However, the dummy gate structure DG is electrically floating. That is, the dummy gate structure DG is not electrically connected to any outside circuits.

In accordance with some embodiments of the present disclosure, a semiconductor device includes a substrate, a plurality of memory cells, and at least one dummy gate structure. The substrate has a memory cell region and a dummy region. The memory cells are disposed on the substrate in the memory cell region. Each memory cell includes: adjacent two stack structures disposed on the substrate; two select gates respectively disposed outside the adjacent two stack structures; and an erase gate disposed between the adjacent two stack structures. The erase gate has a step between a topmost top surface and a lowermost top surface of the erase gate. The at least one dummy gate structure is disposed on the substrate in the dummy region.

In accordance with alternative embodiments of the present disclosure, a semiconductor device includes a substrate and a plurality of memory cells. The memory cells are disposed on the substrate. Each memory cell includes adjacent two stack structures disposed on the substrate; two select gates respectively disposed outside the adjacent two stack structures; and an erase gate disposed between adjacent two stack structures. The erase gate and the two select gates have the same conductive material and are formed in the same step.

In accordance with yet alternative embodiments of the present disclosure, a semiconductor device includes a substrate having a memory cell region and a non-memory cell region; a first stack structure and a second stack structure disposed on the substrate in the memory cell region; and a plurality of third stack structures disposed on the substrate in the non-memory cell region. The first, second, and third stack structures are formed in the same step.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having a memory cell region and a dummy region;
a plurality of memory cells disposed on the substrate in the memory cell region, wherein each memory cell comprises:
adjacent two stack structures disposed on the substrate;
two select gates respectively disposed outside the adjacent two stack structures; and
an erase gate disposed between the adjacent two stack structures, wherein the erase gate has a step between a topmost top surface and a lowermost top surface of the erase gate; and
at least one dummy gate structure disposed on the substrate in the dummy region.

2. The semiconductor device of claim 1, wherein a top surface of the erase gate comprises a U-shaped surface, while top surfaces of the two select gates comprise flat surfaces.

3. The semiconductor device of claim 1, wherein each stack structure comprises a tunnel dielectric layer, a floating gate, an inter-gate dielectric layer, and a control gate, from bottom to top.

4. The semiconductor device of claim 3, further comprising:
a first spacer covering a sidewall of the control gate and a sidewall of the inter-gate dielectric layer, wherein the first spacer has an outer sidewall aligned with a sidewall of the floating gate; and
a second spacer covering the outer sidewall of the first spacer and the sidewall of the floating gate.

5. The semiconductor device of claim 1, further comprising at least one logic gate structure disposed on the substrate in a logic region.

6. The semiconductor device of claim 5, wherein the at least one logic gate structure has a height lower than a height of the at least one dummy gate structure, lower than a height of the two select gates, and lower than a height of the erase gate.

7. The semiconductor device of claim 1, wherein the at least one dummy gate structure and the stack structures are formed in the same step.

8. A semiconductor device, comprising:
a substrate; and
a plurality of memory cells disposed on the substrate, wherein each memory cell comprises:
adjacent two stack structures disposed on the substrate;
two select gates respectively disposed outside the adjacent two stack structures; and
an erase gate disposed between adjacent two stack structures, wherein the erase gate and the two select gates have the same conductive material, wherein the erase gate has a step between a topmost top surface and a lowermost top surface of the erase gate.

9. The semiconductor device of claim 8, wherein the substrate has a memory cell region, a logic region, and a dummy region, and the plurality of memory cells are disposed in the memory cell region.

10. The semiconductor device of claim 9, further comprising at least one dummy gate structure disposed on the substrate in the dummy region, wherein the at least one dummy gate structure is electrically floating.

11. The semiconductor device of claim 10, further comprising at least one logic gate structure disposed on the substrate in a logic region.

12. The semiconductor device of claim 11, wherein the at least one logic gate structure has a height lower than a height of the at least one dummy gate structure, lower than a height of the two select gates, and lower than a height of the erase gate.

13. The semiconductor device of claim 10, wherein the at least one dummy gate structure and the stack structures have the same height.

14. The semiconductor device of claim 8, wherein a top surface of the erase gate comprises a U-shaped surface, while top surfaces of the two select gates comprise flat surfaces.

15. The semiconductor device of claim 8, wherein each stack structure comprises a tunnel dielectric layer, a floating gate, an inter-gate dielectric layer, and a control gate, from bottom to top.

16. The semiconductor device of claim 15, further comprising:
a common source region disposed in the substrate under the erase gate;
an erase-gate dielectric layer disposed between the common source region and the erase gate, wherein the erase-gate dielectric layer has a thickness thicker than a thickness of the tunnel dielectric layer; and
two doped regions disposed outside the two select gates, wherein the two doped regions and the common source region have the same conductive type dopant.

17. A semiconductor device, comprising:
a substrate having a memory cell region and a non-memory cell region;
a first stack structure and a second stack structure disposed on the substrate in the memory cell region; and
a plurality of third stack structures disposed on the substrate in the non-memory cell region, wherein the first and second stack structures are strip patterns, the plurality of third stack structures are island patterns separated from each other, and the plurality of third stack structures are arranged around the first and second stack structures,
wherein a ratio of a sum area of the first, second and third stack structures projected onto the substrate and an area of the substrate is in a range from 10% to 90%.

18. The semiconductor device of claim 17, wherein the plurality of third stack structures comprise dummy gate structures, and the dummy gate structures are electrically floating.

19. The semiconductor device of claim 17, further comprising:
two select gates respectively disposed outside the first and second stack structures; and
an erase gate disposed between the first and second stack structures.

20. The semiconductor device of claim 19, wherein the erase gate has a step between a topmost top surface and a lowermost top surface of the erase gate.

* * * * *